(12) United States Patent
Ahn et al.

(10) Patent No.: US 6,395,630 B2
(45) Date of Patent: May 28, 2002

(54) STACKED INTEGRATED CIRCUITS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/854,809

(22) Filed: May 14, 2001

Related U.S. Application Data

(62) Division of application No. 09/665,255, filed on Sep. 19, 2000, now Pat. No. 6,314,013, which is a continuation of application No. 09/198,554, filed on Nov. 23, 1998, now Pat. No. 6,122,187.

(51) Int. Cl.$^7$ .............................................. H01L 21/20
(52) U.S. Cl. ........................ 438/667; 438/613; 257/673
(58) Field of Search .................. 438/389, 542, 438/667, 668, 613; 257/673, 686, 774, 777; 365/52, 63; 264/104

(56) References Cited

U.S. PATENT DOCUMENTS

| | | | |
|---|---|---|---|
| 3,698,082 A | * 10/1972 | Hyltin et al. ................... 29/624 |
| 4,394,712 A | 7/1983 | Anthony ....................... 361/411 |
| 5,128,831 A | 7/1992 | Fox, III et al. ............. 361/396 |
| 5,200,917 A | 4/1993 | Shaffer .......................... 365/51 |
| 5,352,998 A | 10/1994 | Tamino ....................... 333/247 |
| 5,362,976 A | 11/1994 | Suzuki .......................... 257/81 |
| 5,399,898 A | 3/1995 | Rostoker ...................... 257/499 |
| 5,404,044 A | 4/1995 | Booth et al. ................. 257/686 |
| 5,432,729 A | 7/1995 | Carson et al. ................. 365/63 |
| 5,434,452 A | 7/1995 | Higgins, III ................. 257/773 |
| 5,532,506 A | 7/1996 | Tserng ......................... 257/276 |
| 5,578,526 A | 11/1996 | Akram ........................ 437/209 |
| 5,587,119 A | * 12/1996 | White .......................... 264/104 |
| 5,608,265 A | 3/1997 | Kitano et al. ................. 257/738 |
| 5,656,548 A | 8/1997 | Zavracky et al. ............. 438/23 |
| 5,661,901 A | 9/1997 | King ............................ 29/830 |
| 5,682,062 A | 10/1997 | Gaul ........................... 257/686 |
| 5,696,031 A | 12/1997 | Wark .......................... 437/209 |
| 5,767,001 A | 6/1998 | Bertagnolli et al. ......... 438/455 |
| 5,783,870 A | 7/1998 | Mostafazadeh et al. ..... 252/686 |
| 5,789,271 A | 8/1998 | Akram ........................ 438/18 |
| 5,801,452 A | 9/1998 | Farnworth ................... 257/797 |
| 5,808,360 A | 9/1998 | Akram ........................ 257/738 |
| 5,814,889 A | 9/1998 | Gaul ........................... 257/774 |
| 5,818,697 A | 10/1998 | Armezzani et al. .......... 361/749 |
| 5,834,366 A | 11/1998 | Akram ........................ 438/614 |
| 5,901,050 A | 5/1999 | Imai ............................ 361/820 |
| 5,902,118 A | 5/1999 | Hubner ....................... 438/106 |
| 5,903,045 A | 5/1999 | Bertin et al. ................. 257/621 |
| 5,915,167 A | 6/1999 | Leedy ......................... 438/108 |
| 5,973,392 A | 10/1999 | Senba et al. ................. 257/686 |
| 5,995,379 A | 11/1999 | Kyougoku et al. .......... 361/803 |
| 6,143,616 A | * 11/2000 | Geusic et al. ............... 438/667 |

FOREIGN PATENT DOCUMENTS

WO 94/05039 3/1994 ........... H01L/23/48

OTHER PUBLICATIONS

Bauer, C.E., "Three Dimensional Multichip Modules", *Proceedings of the Technical Program—National Electronic Packaging and Production Conference, NEPCON West '94*, 2444, , 2001–2005, (1993).

(List continued on next page.)

*Primary Examiner*—Tan T. Nguyen
(74) *Attorney, Agent, or Firm*—Schwegman, Lundberg, Woessner & Kluth, P.A.

(57) ABSTRACT

System modules are described which include a stack of interconnected semiconductor dies. The semiconductor dies are interconnected by micro bump bonding of coaxial lines that extend through the thickness of the various dies. The coaxial lines also are selectively connected to integrated circuits housed within the dies. In one embodiment, a number of memory dies are interconnected in this manner to provide a memory module.

29 Claims, 4 Drawing Sheets

OTHER PUBLICATIONS

Ganasan, J.R., "3 D Packaging—Combining Chip on Chip (COC) and Chip on Board (COB) Packages—Process and Design Considerations", *Proceedings of 1997 IEEE Electronic Components and Technology Conference*, 1210–1213, (1997).

Horie, H., et al., "Novel High Aspect Ratio Aluminum Plug for Logic/DRAM LSI's Using Polysilicon–Aluminum Substitute", *Technical Digest: IEEE International Electron Devices Meeting*, San Francisco, CA, 946–948, (1996).

Lehmann, V., "The Physics of Macropore Formation in Low Doped n–Type Silicon", *Journal of the Electrochemical Society*, 140(10), 2836–2843, (Oct. 1993).

Mimura, T., et al., "System Module: a New Chip–on–Chip Module Technology", *Proceedings of 1997 IEEE Custom Integrated Circuit Conference*, 439–442, (1997).

Rabaey, J.M., "Digital Integrated Circuits, a design perspective", *Prentice Hall*, Upper Saddle River, NJ, 478, (1996).

Ramo, S., et al., "Fields and Waves in Communication Electronics", *John Wiley & Sons, Inc., New York, 3rd ed.*, 250, (1994).

Senba, N., et al., "Application of 3–Dimensional Memory Module", *Proceedings of 1996 International Symposium on Microelectronics, SPIE 2920*, 279–84, (1996).

Seraphim, D.P., et al., "Principles of Electronic Packaging.", *In: Principles of Electronic Packaging*, McGraw–Hill, New York, NY, 44, 190, 595–597, (1989).

Shibuya, A., et al., "New MCM Composed of D/L Base Substrate, High–Density–Wiring CSP and 3D Memory Modules", *Proceedings of 1997 IEEE Electronic Components and Technology Conference*, 491–496, (1997).

Val, et al., "The 3D Interconnection—Applications for Mass Memories and Microprocessors", *ISHIM 1991 Proceedings of the International Symposium on Microelectronics*, 62–68, (1991).

* cited by examiner

STACKED INTEGRATED CIRCUITS

This application is a Divisional of U.S. application Ser. No. 09/665,255, filed Sep. 19, 2000 now U.S. Pat. No. 6,314,013, which is a Continuation of U.S. application Ser. No. 09/198,554, filed Nov. 23, 1998, now U.S. Pat. No. 6,122,187.

TECHNICAL FIELD OF THE INVENTION

The present invention relates generally to the field of integrated circuits and, in particular, to stacked integrated circuits.

BACKGROUND OF THE INVENTION

Integrated circuits form the basis for many electronic systems. Essentially, an integrated circuit includes a vast number of transistors and other circuit elements that are formed on a single semiconductor wafer or chip and are interconnected to implement a desired function. The complexity of these integrated circuits requires the use of an ever increasing number of linked transistors and other circuit elements.

Many electronic systems are created through the use of a variety of different integrated circuits; each integrated circuit performing one or more specific functions. For example, computer systems include at least one microprocessor and a number of memory chips. Conventionally, each of these integrated circuits is formed on a separate wafer or chip, packaged independently and interconnected on, for example, a printed circuit board.

As integrated circuit technology progresses, there is a growing desire for a "system on a chip" in which the functionality of all of the integrated circuits of the system are packaged together without a conventional printed circuit board. Ideally, a computing system would be fabricated with all the necessary integrated circuits on one wafer, as compared with today's method of fabricating many chips of different functions and packaging them to assemble a complete system. Such a structure would greatly improve integrated circuit performance and provide higher bandwidth.

In practice, it is very difficult with today's technology to implement a truly high-performance "system on a chip" because of vastly different fabrication processes and different manufacturing yields for the logic and memory circuits.

As a compromise, various "system modules" have been introduced that electrically connect and package integrated circuit devices which are fabricated on the same or on different semiconductor wafers. Initially, system modules were created by simply stacking two semiconductor chips, e.g., a logic and memory chip, one on top of the other in an arrangement commonly referred to as chip-on-chip (COC) structure. Chip-on-chip structures most commonly use micro bump bonding technology (MBB) to electrically connect the working surfaces of two chips. Several problems, however, remain inherent with this design structure. For example, this approach is limited in the number of chips that can be interconnected as part of the system module.

Some researchers have attempted to develop techniques for interconnecting a number of chips in a stack to form a system module. However, these modules suffer from additional problems. For example, some modules use chip carriers that make the packaging bulky. Further, others use wire bonding that gives rise to stray inductances that interfere with the operation of the system module.

Thus, it is desirable to develop an improved structure and method for interconnecting integrated circuits on separate chips or wafers in a system module.

SUMMARY OF THE INVENTION

The above mentioned problems with integrated circuits and other problems are addressed by the present invention and will be understood by reading and studying the following specification. System modules are described which include a stack of interconnected semiconductor chips, wafers or dies. The semiconductor dies are interconnected by micro bump bonding of coaxial conductors that extend through the thickness of the various dies. The coaxial lines also are selectively connected to integrated circuits housed within the dies. In one embodiment, a number of memory dies are interconnected in this manner to provide a memory module.

DETAILED DESCRIPTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

In the following description, the terms chip, die, wafer and substrate are interchangeably used to refer generally to any structure, or portion of a structure, on which integrated circuits are formed, and also to such structures during various stages of integrated circuit fabrication. The terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

I. System Module

Figure 1:
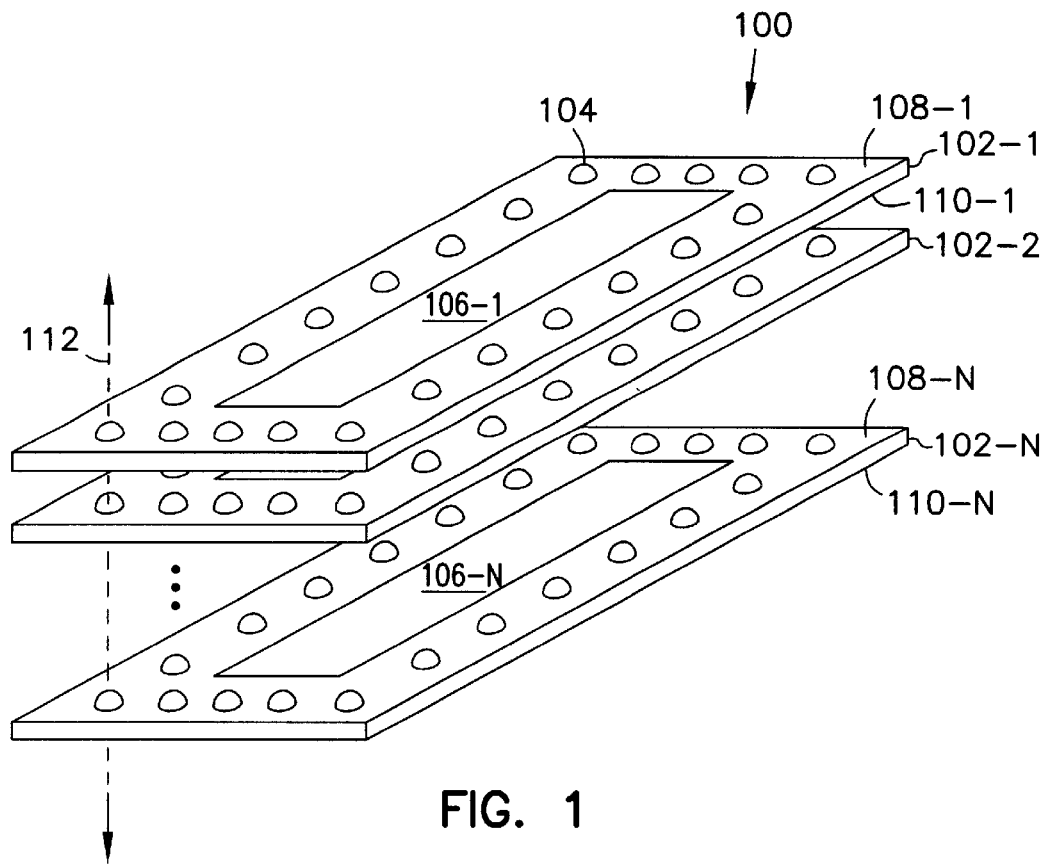
FIG. 1 is a perspective view of an embodiment of a system module according to the teachings of the present invention.

FIG. 1 is a perspective view of an embodiment of a system module, indicated generally at 100, according to the teachings of the present invention. System module 100 includes a plurality of semiconductor chips 102-1, . . . , 102-N that are disposed and interconnected in a stack to provide "chip-sized" packaging. Each semiconductor chip 102-1, . . . , 102-N includes integrated circuits 106-1, . . . , 106-N, respectively. In one embodiment, semiconductor chips 102-1, . . . , 102-N comprise semiconductor dies with memory circuits such as dynamic random access memory circuits. Thus, in this embodiment, system module 100 is a "memory module" or "memory cube." In other embodiments, integrated circuits 106-1 . . . , 106-N comprise other appropriate circuits such as logic circuits.

System module 100 uses microbumps 104 to interconnect the integrated circuits 106-1, . . . , 106-N. In one embodiment, microbumps 104 comprise controlled-collapse chip connections (C-4) solder pads. Other appropriate materials can be used to form microbumps 104. Microbumps 104 are formed on first sides 108-1, . . . , 108-N and second sides 110-1, . . . , 110-N of semiconductor chips 102-1, . . . , 102-N. The microbumps 104 are connected to coaxial conductors, described in more detail below, to carry signals between semiconductor wafers 102-1, . . . , 102-N. Microbumps 104 are selectively formed using, for example, a vacuum deposition through a mask. The deposited material is then reflowed to homogenize lead and tin as the microbumps. Selected microbumps 104 are aligned and bonded, e.g., the microbumps indicated by arrow 112, by bringing the respective microbumps 104 into contact at an appropriate temperature.

II. Coaxial Conductors and Microbumps

Figure 2:
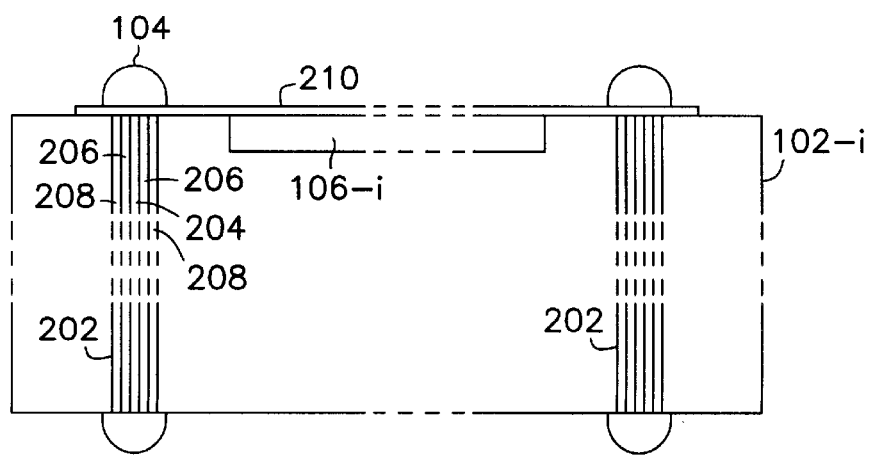
FIG. 2 is a cross sectional view of a semiconductor chip or die of the system module of FIG. 1.

FIG. 2 is a cross sectional view of a semiconductor chip, indicated generally at 102-I, according to an embodiment of the present invention. Semiconductor chip 102-I includes coaxial conductors 202 that are formed in high aspect ratio vias through the thickness of semiconductor chip 102-I. The coaxial conductors 202 have an aspect ratio in the range of approximately 100 to 200. Conventionally, a semiconductor wafer used to form an integrated circuit has a thickness in the range of approximately 500 to 1000 microns. Thus, the high aspect ratio vias can be fabricated with a width that is in the range from approximately 2.5 microns up to as much as approximately 10 microns.

Coaxial conductors 202 include center conductor 204 that is surrounded by insulator, e.g., oxide, 206. Further, outer conductor 208 surrounds insulator 206. Coaxial conductor 202 is shown in cross section in FIG. 3. Outer conductor 208 comprises, for example, a metal layer that is deposited within the high aspect ratio via. Alternatively, outer conductor 208 may comprise a portion of semiconductor chip 102-I that has been doped with impurities to render it conductive.

Coaxial conductor 202 is selectively coupled to integrated circuit 106-I using a metallization layer 210. Further, microbumps 104 are formed outwardly from the metallization layer 210 to provide for interconnection with other semiconductor wafers in a stack to form a system module.

Advantageously, coaxial conductors 202 allow a number of semiconductor wafers to be interconnected in a stack with an increased density over other system modules. The space between semiconductor wafers in system module 100 is on the order of a few microns, e.g., the thickness of two bonded, solder microbumps. Assuming a wafer thickness on the order of 750 microns, eight semiconductor wafers can be stacked to form a system module with a thickness on the order of 6 millimeters. This compact system module can be readily mounted into a variety of system packages.

The use of microbumps to interconnect the semiconductor wafers in a stack provides additional advantages. For example, stray capacitance, stray inductance and series resistance are all reduced over other system modules. This ultimately results in improved performance.

Figure 3:
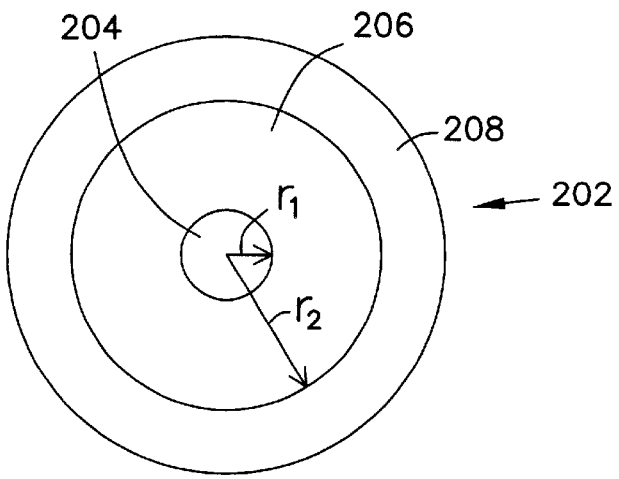
FIG. 3 is a cross sectional view of an embodiment of a coaxial conductor.

The coaxial conductor 202 shown in FIGS. 2 and 3 have, for simplicity, a geometry such that:

$$\rightarrow \frac{1}{\pi}\ln\!\left(\frac{r_2}{r_1}\right) = 1 \rightarrow$$

In this case, the capacitance of coaxial conductor is:

$$C = 2\,\frac{\pi}{\ln\!\left(\frac{r_2}{r_1}\right)}e_r e_0 d$$

The term $e_r e_0$ is the electric permittivity of insulator layer 206 and d is the length of coaxial conductor 202. If insulator layer 206 is silicon dioxide and the coaxial conductor has a length of approximately 750 microns, then the capacitance is approximately 50 femtofarads (fF). Likewise, the inductance can be calculated as follows:

$$L = \mu_0\!\left(\frac{1}{2\pi}\right)\ln\!\left(\frac{r_2}{r_1}\right) d$$

In this equation, $\mu_0$ is the magnetic permeability of free space. Continuing with the same assumptions, this provides an inductance on the order of 0.5 nanohenries (nH). These values are less than those associated with a conventional wire bond, e.g., 500 to 1000 fF and 1–2 nH. Further, the large stray capacitances and inductances (1–7 picofarads (pF) and 2–35 nH) associated with a package and even larger capacitances and inductances associated with a printed circuit board are avoided.

The microbumps of system 100 have only a small stray capacitance, e.g., 100 to 500 fF, and a small inductance of less than 0.1 nH. The net result is that the interconnection between the semiconductor chips 102-1, . . . , 102-N of system 100 can be made with about the same stray capacitance and inductance as that of a single wire bond. Alternative connection techniques would require significantly more wire bonds and huge stray inductances and capacitances associated with the packaging and even larger strays associated with interconnection of the packages.

Coaxial conductors 202 can be added to circuits using a conventional layout for the circuit without adversely affecting the surface area requirements of the circuit. Conventional circuits typically include pads formed on the top surface of the semiconductor wafer that are used to connect to various signals for the system. The bond wires of conventional circuits can be replaced by coaxial conductors 202 and microbumps 104 to achieve the advantages described above.

III. Formation of Coaxial Conductors and Microbumps

FIGS. 4, 5, 6, 7, 8, and 9 are elevational views of semiconductor chip 102-I at various points of an illustrative embodiment of a method for forming an integrated circuit with coaxial conductors according to the teachings of the present invention. Functional circuit 402 is formed in an active region of semiconductor wafer 400. In one embodiment, semiconductor wafer 400 comprises a monocrystalline silicon wafer. For purposes of clarity, the Figures only show the formation of two coaxial conductors through semiconductor wafer 400. However, it is understood that with a particular functional circuit any appropriate number of vias can be formed through semiconductor wafer 400. For example, the number of vias needed for a conventional dynamic random access memory (DRAM) may be on the order of 100. Essentially, the coaxial conductors are formed in the same space on the surface of semiconductor wafer 400 that is conventionally used to form bond pads to be connected to leads. The coaxial conductors replace the conventional bond wires which couple the bond pads to selected leads of a lead frame in the packaging of the semiconductor wafer.

Figure 4:
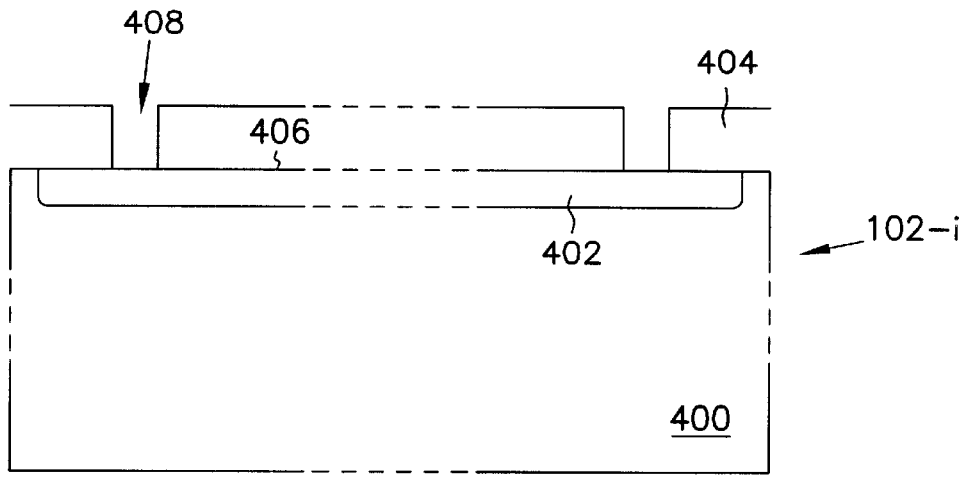
FIGS. 4, 5, 6, 7, 8, and 9 are elevational views of a semiconductor wafer at various points of an illustrative embodiment of a method according to the teachings of the present invention.

As shown in FIG. 4, photoresist layer 404 is formed on surface 406 of semiconductor substrate 400. Photoresist layer 404 is patterned to provide openings 408 at points on surface 406 where high aspect ratio holes are to be formed through semiconductor wafer 400.

Figure 5:
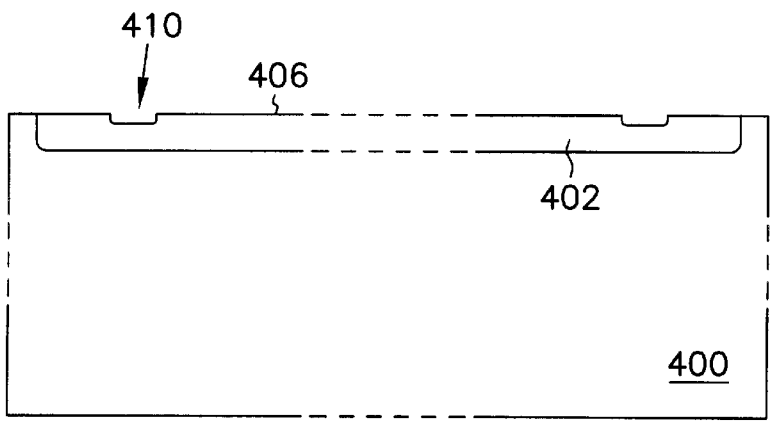

As shown in FIG. 5, etch pits 410 are formed by conventional alkaline etching through openings 408 in photoresist layer 404. Photoresist layer 404 is then removed.

Figure 6:
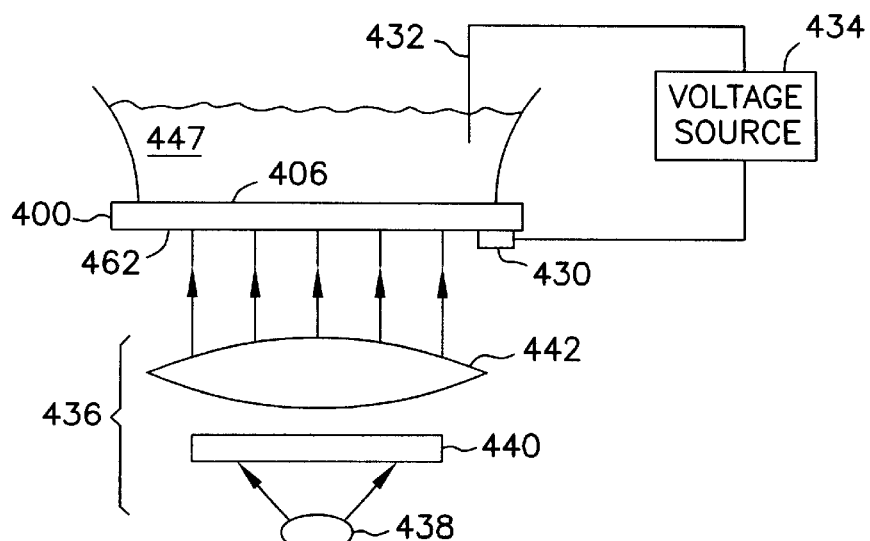
Figure 7:
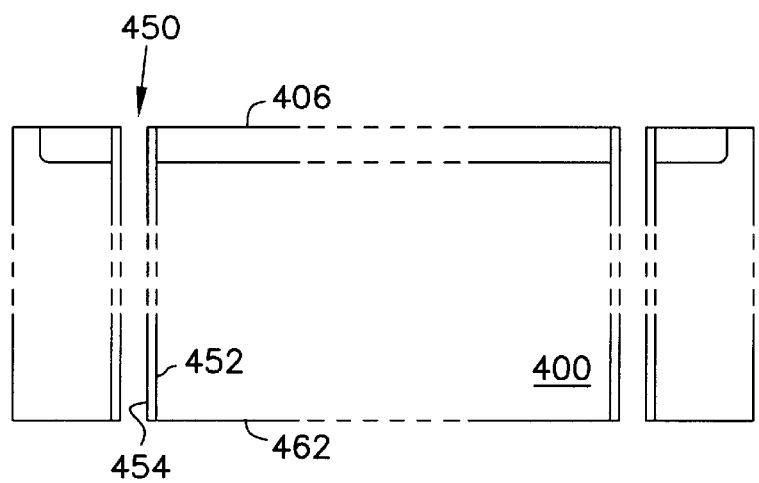

FIG. 6 is a schematic diagram that illustrates an embodiment of a layout of equipment used to carry out an anodic etch that is used to form high aspect ratio holes 450 of FIG. 7. Typically, holes 450 have an aspect ratio in the range of 100 to 200. Bottom surface 462 of semiconductor wafer 400 is coupled to voltage source 434 by positive electrode 430. Further, negative electrode 432 is coupled to voltage source 434 and is placed in a bath of 6% aqueous solution of hydrofluoric acid (HF) on surface 406 of semiconductor wafer 400.

In this example, illumination equipment 436 is also included because semiconductor wafer 400 is n-type semiconductor material. When p-type semiconductor material is used, the illumination equipment is not required. Illumination equipment 436 assures that there is a sufficient concentration of holes in semiconductor wafer 400 as required by the anodic etching process. Illumination equipment 436 includes lamp 438, IR filter 440, and lens 442. Illumination equipment 436 focuses light on surface 462 of semiconductor wafer 400.

In operation, the anodic etch etches high aspect ratio holes through semiconductor wafer 400 at the location of etch pits 410. Voltage source 434 is turned on and provides a voltage across positive and negative electrodes 430 and 432. Etching current flows from positive electrode 430 to surface 406. This current forms the high aspect ratio holes through semiconductor wafer 400. Further, illumination equipment illuminates surface 462 of semiconductor wafer 400 so as to assure a sufficient concentration of holes for the anodic etching process. The size and shape of the high aspect ratio holes through semiconductor wafer 400 depends on, for example, the anodization parameters such as HF concentration, current density, and light illumination. An anodic etching process is described in V. Lehmann, *The Physics of Macropore Formation in Low Doped n-Type Silicon*, J. Electrochem. Soc., Vol. 140, No. 10, pp. 2836–2843, October 1993, which is incorporated herein by reference.

FIG. 7 illustrates the formation of the outer conductor 454 of a coaxial conductor. Outer conductor 454 can be formed in at least one of two ways. First, outer conductor 454 can be formed using a low pressure chemical vapor deposition of tungsten in a self-limiting process which provides a tungsten film on inner surface 452 of holes 450 by silicon reduction. Accordingly, silicon material within holes 450 is replaced by tungsten atoms in a $WF_6$ reaction gas. A reaction product, $SiF_4$ is pumped out or otherwise removed from the reaction chamber. This can be followed by a silane or polysilane reduction of the $WF_6$ until a desired thickness is achieved. Deposition rates for this process are dependent on temperature and reaction gas flow rate. Deposition rates of 1 micron per minute have been observed at temperatures of 300° C. and with a flow rate of $WF_6$ at 4 sccm in a cold wall CVD reactor.

Alternatively, outer conductor 454 can be formed as diffusion regions within semiconductor wafer 400 along inner surface 450. To accomplish this, surfaces 406 and 462 are masked by a masking layer and conductivity enhancing impurities are introduced. The impurities form outer conductor 454 as, for example, n+ regions.

Figure 8:
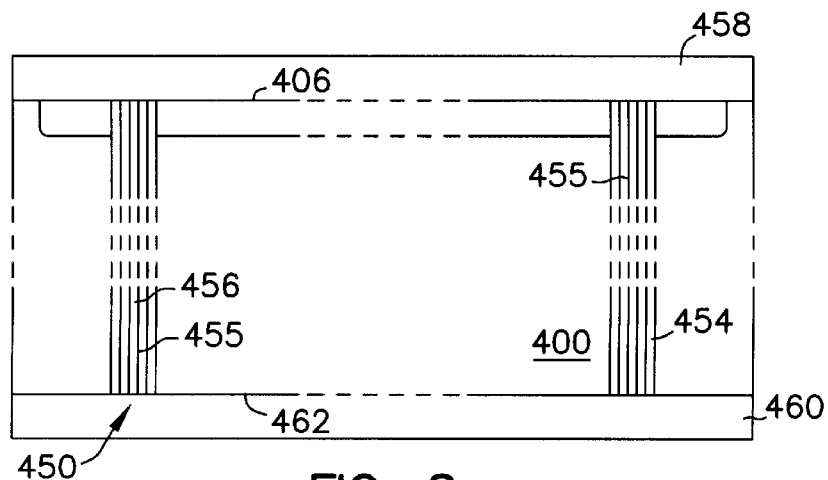
Figure 9:
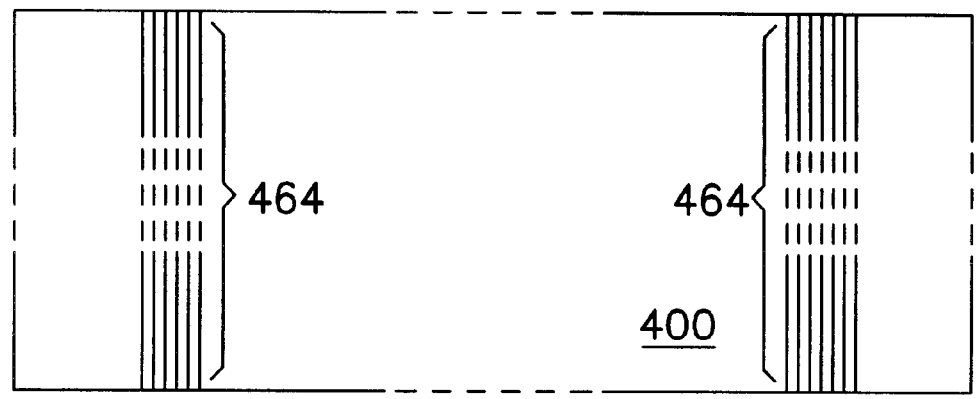

FIGS. 8 and 9 illustrate the completion of the coaxial conductors. First, an insulator material, e.g., silicon dioxide, is formed in holes 450 along the length of outer conductor 454 to form insulator layer 455. Insulator layer 455 is formed so as to leave an opening extending through the thickness of semiconductor wafer 400.

Next, a process of aluminum/polysilicon substitution is used to fill the remaining portion of holes 450 with aluminum. Such a process is described in H. Horie et al., *Novel High Aspect Ratio Aluminum Plug for Logic/DRAM LSIs Using Polysilicon-Aluminum Substitute*, Dig. IEEE Int. Electron Device Meeting, San Francisco, pp. 946–948, 1996, which is incorporated herein by reference. First, hole 450 is filled with a layer of polysilicon 456 by a process of chemical vapor deposition (CVD). It is noted that, conventionally, such a deep trench cannot be filled directly with aluminum using a direct chemical vapor deposition technique. However, conventionally, polysilicon has been deposited in holes with such high aspect ratios, e.g., deep trenches for trench capacitors. Once the holes are filled with polysilicon, excess polysilicon on surface 406 is removed by, for example, chemical/mechanical polishing. Aluminum layers 458 and 460 are deposited on surfaces 406 and 462 using, for example, a sputtering technique used to coat optical disks. Layers 458 and 460 have a thickness on the order of a few microns. The structure shown in FIG. 8 is then annealed at 500 degrees Celsius in Nitrogen ambient. This allows the aluminum material of layers 458 and 460 to be substituted for the polysilicon 456 in holes 450. The displaced polysilicon and any residual aluminum from layers 458 and 460 are removed by, for example, chemical/mechanical polishing. By depositing a thin, e.g., 0.1 μm, layer of titanium on top of layers 458 and 460 the above mentioned anneal can be reduced from 500° Celsius to 450° Celsius. The structure is now as shown in FIG. 9 with coaxial conductors 464 extending through semiconductor wafer 400.

IV. Electronic System

Figure 10:
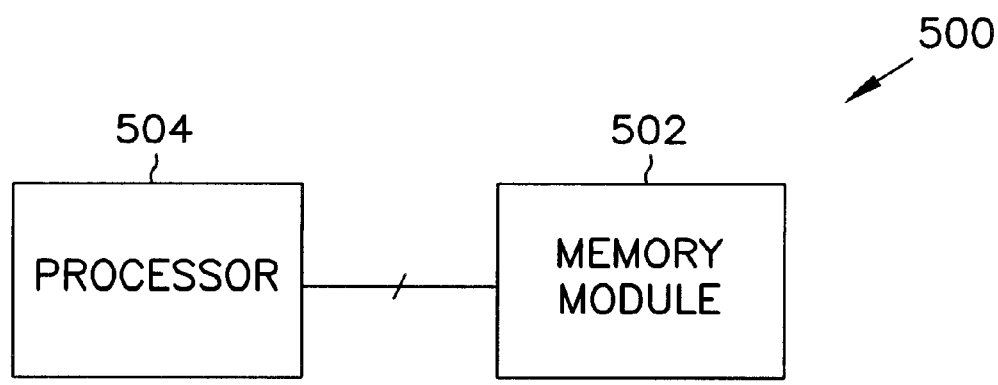
FIG. 10 is a block diagram of an embodiment of an electronic system according to the teachings of the present invention.

FIG. 10 is a block diagram of an embodiment of an electronic system, indicated generally at 500, and constructed according to the teachings of the present invention. System 500 includes processor 504 and memory module 502. Memory module 502 includes a number of memory circuits that are fabricated on separate semiconductor chips or dies. These dies include a plurality of coaxial conductors that are formed through the thickness of their respective dies as described in more detail above. These coaxial conductors are interconnected with other semiconductor chips using a microbump bonding, e.g., C-4 type microbumps.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the high aspect ratio vias can be applied in a wide variety of circuits including but not limited to dynamic random access memory devices, logic circuits, and other appropriate circuits. Further, other techniques can be used to form and fill the high aspect ratio holes to form the coaxial conductors. Further, the high aspect ratio vias can be filed with a conductive material without forming a coaxial conductor.

What is claimed is:

1. A method for forming a coaxial conductor in a semiconductor chip, the chip having a first and second side and a thickness defined by the first and second sides, comprising:
    removing material from the chip to form a hole through the thickness of the chip, the hole having an inner wall;
    forming an outer conductor on the inner wall of the hole;
    forming an insulator layer radially adjacent the outer conductor;
    filling in the remaining space of the hole with a conducting material to form a center conductor; and
    selectively forming microbumps on a first or second end of the coaxial conductor, the first and second ends corresponding to the first and second sides of the semiconductor chip.

2. The method of claim 1 wherein selectively forming microbumps comprises selectively forming controlled-collapse chip connection (C-4) solder pads.

3. A method for forming a coaxial conductor in a semiconductor chip, the chip having a first and second side and a thickness defined by the first and second sides, comprising:
    removing material from the chip to form a hole through the thickness of the chip, the hole having an inner wall;
    forming an outer conductor on the inner wall of the hole;
    forming an insulator layer radially adjacent the outer conductor;
    filling in the remaining space of the hole with an aluminum containing conducting material to form a center conductor; and
    selectively forming a microbump on at least one end of the coaxial conductor.

4. The method of claim 3 wherein forming the outer conductor comprises depositing tungsten on the inner wall of the hole.

5. The method of claim 3 wherein forming the outer conductor comprises diffusing a conductivity enhancing impurity into the inner wall of the hole.

6. The method of claim 3 wherein forming an insulator layer comprises coating the outer conductor with an insulating material.

7. The method of claim 6 wherein the insulating material is comprised of silicon dioxide.

8. The method of claim 3 wherein selectively forming a microbump includes selectively forming a controlled-collapse chip connection (C-4) solder pad.

9. A method for forming a coaxial conductor in a semiconductor chip, the chip having a first and second side and a thickness defined by the first and second sides, comprising:
    removing material from the chip to form a hole through the thickness of the chip, the hole having an inner wall;
    forming an outer conductor on the inner wall of the hole;
    forming an insulator layer radially adjacent the outer conductor;
    filling in the remaining space with aluminum to form a center conductor comprising:
        filling in the remaining space of the hole with polysilicon;
        coating the first and second sides of the chip with a layer of aluminum;
        heating the chip to an anneal temperature, causing substitution of aluminum for polysilicon;
        removing excess aluminum and polysilicon from the first and second sides of the semiconductor chip; and
    selectively forming a microbump on at least one end of the coaxial conductor.

10. The method of claim 9 wherein heating the chip to an anneal temperature comprises heating the chip to an anneal temperature approximately equal to 500 degrees Celsius.

11. The method of claim 9 wherein filling in the remaining space with aluminum to form a center conductor further comprises coating a layer of titanium on top of the layer of aluminum before heating; and
    wherein heating the chip to an anneal temperature comprises heating the chip to an anneal temperature approximately equal to 450 degrees Celsius.

12. A method for forming a coaxial conductor in a semiconductor chip, the chip having a first and second side and a thickness defined by the first and second sides, comprising:
    utilizing anodic etching to form a hole through the thickness of the chip, the hole having an inner wall;
    forming an outer conductor on the inner wall of the hole;
    forming an insulator layer radially adjacent the outer conductor;
    filling in the remaining space of the hole with an aluminum containing conducting material to form a center conductor; and
    selectively forming a microbump on at least one end of the coaxial conductor.

13. The method of claim 12 wherein utilizing anodic etching comprises:
    forming a starting etch pit on the first side of the chip;
    bringing the starting etch pit into contact with an acid bath solution;
    coupling the second side of the chip to a positive electrode of a voltage source; and
    coupling the acid bath solution to a negative electrode of a voltage source.

14. The method of claim 13, wherein forming a coaxial conductor in a semiconductor chip includes forming a coaxial conductor in an n-type semiconductor chip; and
    wherein utilizing anodic etching further comprises illuminating the second side of the chip to assure a sufficient concentration of electron holes.

15. The method of claim 13 wherein bringing the starting etch pit into contact with an acid bath solution comprises bringing the starting etch pit into contact with a 6% aqueous solution of hydrofluoric acid.

16. The method of claim 12 wherein utilizing anodic etching to form a hole through the thickness of the chip includes utilizing anodic etching to form a hole through the thickness of the chip with an aspect ratio of at least 100:1.

17. A method for forming a coaxial conductor in a semiconductor chip, the chip having a first and second side and a thickness defined by the first and second sides, comprising:
    utilizing anodic etching to form a hole through the thickness of the chip, the hole having an inner wall;

forming an outer conductor on the inner wall of the hole;

forming an insulator layer radially adjacent the outer conductor;

filling in the remaining space of the hole with a conducting material to form a center conductor; and selectively forming microbumps on a first or second end of the coaxial conductor, the first and second ends corresponding to the first and second sides of the semiconductor chip.

18. The method of claim 17 wherein selectively forming microbumps comprises selectively forming controlled-collapse chip connection (C-4) solder pads.

19. The method of claim 17 wherein utilizing anodic etching comprises:

forming a starting etch pit on the first side of the chip;

bringing the starting etch pit into contact with an acid bath solution;

coupling the second side of the chip to a positive electrode of a voltage source; and coupling the acid bath solution to a negative electrode of a voltage source.

20. The method of claim 19, wherein forming a coaxial conductor in a semiconductor chip includes forming a coaxial conductor in an n-type semiconductor chip; and wherein utilizing anodic etching further comprises illuminating the second side of the chip to assure a sufficient concentration of electron holes.

21. The method of claim 19 wherein bringing the starting etch pit into contact with an acid bath solution comprises bringing the starting etch pit into contact with a 6% aqueous solution of hydrofluoric acid.

22. The method of claim 17 wherein utilizing anodic etching to form a hole through the thickness of the chip includes utilizing anodic etching to form a hole through the thickness of the chip with an aspect ratio of at least 100:1.

23. A method for forming a coaxial conductor in a semiconductor chip, the chip having a first and second side and a thickness defined by the first and second sides, comprising:

utilizing anodic etching to form a hole through the thickness of the chip, the hole having an inner wall;

forming an outer conductor on the inner wall of the hole, the outer conductor including tungsten;

forming an insulator layer radially adjacent the outer conductor;

filling in the remaining space with aluminum to form a center conductor comprising:

filling in the remaining space of the hole with polysilicon;

coating the first and second sides of the chip with a layer of aluminum;

heating the chip to an anneal temperature, causing substitution of aluminum for polysilicon;

removing excess aluminum and polysilicon from the first and second sides of the semiconductor chip; and selectively forming a microbump on at least one end of the coaxial conductor.

24. The method of claim 23 wherein utilizing anodic etching comprises:

forming a starting etch pit on the first side of the chip;

bringing the starting etch pit into contact with an acid bath solution;

coupling the second side of the chip to a positive electrode of a voltage source; and coupling the acid bath solution to a negative electrode of a voltage source.

25. The method of claim 24, wherein forming a coaxial conductor in a semiconductor chip includes forming a coaxial conductor in an n-type semiconductor chip; and wherein utilizing anodic etching further comprises illuminating the second side of the chip to assure a sufficient concentration of electron holes.

26. The method of claim 24 wherein bringing the starting etch pit into contact with an acid bath solution comprises bringing the starting etch pit into contact with a 6% aqueous solution of hydrofluoric acid.

27. The method of claim 23 wherein utilizing anodic etching to form a hole through the thickness of the chip includes utilizing anodic etching to form a hole through the thickness of the chip with an aspect ratio of at least 100:1.

28. A method for forming a coaxial conductor in a semiconductor chip, the chip having a first and second side and a thickness defined by the first and second sides, comprising:

utilizing anodic etching to form a hole through the thickness of the chip, the hole having an inner wall;

forming an outer conductor on the inner wall of the hole;

forming an insulator layer radially adjacent the outer conductor;

filling in the remaining space with aluminum to form a center conductor comprising:

filling in the remaining space of the hole with polysilicon;

coating the first and second sides of the chip with a layer of aluminum;

heating the chip to an anneal temperature, causing substitution of aluminum for polysilicon;

removing excess aluminum and polysilicon from the first and second sides of the semiconductor chip; and selectively forming microbumps on a first or second end of the coaxial conductor, the first and second ends corresponding to the first and second sides of the semiconductor chip.

29. The method of claim 28 wherein selectively forming microbumps comprises selectively forming controlled-collapse chip connection (C-4) solder pads.

* * * * *